United States Patent
Hansen et al.

(10) Patent No.: US 7,812,316 B2
(45) Date of Patent: Oct. 12, 2010

(54) X-RAY DETECTOR MODULE WITH A COLLIMATOR

(75) Inventors: Karsten Hansen, Hamburg (DE); Alexander Venzmer, Hamburg (DE)

(73) Assignee: Deutsches Electronen-Synchroteron Desy (DE)

( * ) Notice: Subject to any disclaimer, the term of this patent is extended or adjusted under 35 U.S.C. 154(b) by 446 days.

(21) Appl. No.: 12/063,566

(22) PCT Filed: Aug. 9, 2006

(86) PCT No.: PCT/EP2006/007891
§ 371 (c)(1),
(2), (4) Date: Feb. 11, 2008

(87) PCT Pub. No.: WO2007/017272
PCT Pub. Date: Feb. 15, 2007

(65) Prior Publication Data
US 2010/0133442 A1     Jun. 3, 2010

(30) Foreign Application Priority Data
Aug. 10, 2005    (DE) .................... 10 2005 037 860

(51) Int. Cl.
*G01T 1/24*    (2006.01)
(52) U.S. Cl. .................................. 250/370.14
(58) Field of Classification Search ........... 250/370.01–370.15; 378/98.8
See application file for complete search history.

(56) References Cited

U.S. PATENT DOCUMENTS 6,794,654 B1 *   9/2004   Hansen et al. ......... 250/370.09

FOREIGN PATENT DOCUMENTS

| DE | 8621546 U1 | 1/1988 |
| DE | 19929567 A1 | 2/2001 |
| EP | 1400984 A2 | 3/2004 |
| EP | 1431779 A1 | 6/2004 |
| WO | 0079598 A1 | 12/2000 |

OTHER PUBLICATIONS

Hansen et al., "A novel multicell silicon drift detector module for x-ray spectroscopy and imaging applications," 2000, IEEE Transactions on Nuclear Science, vol. 47, No. 6, pp. 2748-2757.*

(Continued)

*Primary Examiner*—David P Porta
*Assistant Examiner*—Kiho Kim
(74) *Attorney, Agent, or Firm*—Hovey Williams LLP

(57) ABSTRACT

An x-ray detector module comprises a plurality of silicon drift detector cells arranged next to each other on a sensor chip. The sensor chip is arranged in a recess of a frame-shaped base support, such that the sensitive chip surface lies in the opening of the frame-shaped base support. A mask (10) is fixed to the side of the base support (2) opposite to the recess and covers the outer edge areas of external detector cells and ridges above the sensor chip (8) protrude into the opening of the base support (2). The ridges are arranged in such a manner that they cover the defining strips which are adjacent to the detector cells, in order to protect the external edge areas and the defining strips which are covered by the mask (10) counter to the incident x-ray photons.

25 Claims, 6 Drawing Sheets

OTHER PUBLICATIONS

Hansen et al., "High-speed high-resolution signal processing for multicell silicon drift detectors," 2002, IEEE Transactions on Nuclear Science, vol. 49, No. 2, pp. 541-547.*

Strueder et al., "Silicon drift detector—the key to new experiments," 1998, Spring-Verlag, Naturwissenschaften, vol. 85, pp. 539-543.*

Lechner et al., "Silicon drift detectors for high resolution, high count rate x-ray spectroscopy at room temperature," 2004, JCPDS-International Centre for Diffraction Data 2004, Advances in X-ray Analysis, vol. 47, pp. 53-58.*

Strueder et al., "High resolution x-ray spectroscopy close to room temperature," 1998, Microscopy and Microanalysis, vol. 4, No. 6, pp. 622-631.*

Office Action dated Jul. 28, 2006 from German Application Serial No. 10 2005 037 860.9.

Hansen, K., "Thermal Performance of a 61-Cell Si-Drift Detector Module with Thermoelectric Cooler", Nuclear Instruments and Methods in Physics Research A517 (2004) 254-263 (Sep. 2003).

* cited by examiner

X-RAY DETECTOR MODULE WITH A COLLIMATOR

CROSS REFERENCE OF RELATED APPLICATIONS

This is a National Phase Application pursuant to 37 C.F.R. §371 of International Application No. PCT/EP2006/007891, filed 9 Aug. 2006, claiming priority of German Application No. 10 2005 037 860.9 filed 10 Aug. 2005. The disclosure of the International Application and the German application being incorporated in their entirety by reference herein.

BACKGROUND OF INVENTION

The present invention relates to an X-ray detector module comprising a plurality of silicon drift detector cells arranged alongside one another on a sensor chip, the sensor chip being accommodated in a cutout of a frame-type basic carrier, such that the sensitive sensor chip surface lies in the opening of the frame-type basic carrier.

DISCUSSION OF PRIOR ART

X-ray detector modules of this type are used e.g. in synchrotron X-ray fluorescence analysis (SyRFA) and in X-ray fine structure spectroscopy (XAFS). Both cases here involve determining the energy of individual X-ray photons. Both cases make high requirements of the detectors, which are intended to detect on the one hand high counting rates of X-ray photons (greater than $10^5$ s$^{-1}$) in conjunction with, on the other hand, very good energy resolution (<500 eV). The counting rates of the semiconductor detectors (HPGe, HPSi, Si(Li), etc.) are already encountering their limits at deflection magnet measuring stations of synchrotron radiation sources.

Since the fine structure effect is small, it is necessary to measure XAFS spectra with high data quality. A number of entries in the line of interest of greater than $10^4$ is necessary for a statistical noise of less than 1%. For a typical measuring time of one second, this results in a corresponding counting rate above $10^4$ s$^{-1}$. In practice, it is even often necessary to have a counting rate which is higher by one to two orders of magnitude, since the amplitude of the XAFS oscillations decreases greatly with increasing distance from the absorption edge and is finally significantly less than 1%. The energy resolution required is a few hundred eV (full width at half maximum). Said resolution is just sufficient for separating the K lines of the 3d metals. Silicon drift detectors are of interest for such applications primarily because they enable a high counting rate in conjunction with sufficiently good energy resolution.

Trace analysis by means of SyRFA requires a high quantum efficiency of the detector in conjunction with high solid-angle coverage, a high signal-to-background ratio and the best possible energy resolution.

DE 199 29 567 A1 discloses an X-ray detector module having the features of the preamble of patent claim 1. A corresponding detector module is described in "Thermal performance of a 61-cell Si-drift detector module with thermoelectric cooler", K. Hansen, Nuclear Instruments and Methods in Physics Research A517 (2004) 254-263. In this detector module, a detector array is formed from 61 hexagonal silicon drift detector cells. Said detector array bears in a cutout of a frame-type basic carrier, such that the sensitive detector surface of the silicon drift detector cells is arranged in a manner facing the opening of the frame-type basic carrier. On the side of the detector array opposite to the sensitive detector surface there follow a line connection carrier, a cover, a radiation shield, and also integrated circuits for preprocessing the signals of the silicon drift detector cells. Although such a detector module can process high counting rates and has a satisfactory energy resolution in the central region of the signal, the recorded spectra manifest a not inconsiderable background of events which are distributed largely energy-independently in widely extending tails. In other words, the signal-to-background ratio is not satisfactory in the known X-ray detector module.

SUMMARY

It is an object of the present invention to provide a compact X-ray detector module which yields a high signal-to-background ratio in addition to the detection capability at high counting rates and a good energy resolution for X-ray photons.

The characterizing features of patent claim 1 in conjunction with the preamble thereof serve for achieving said object. Advantageous embodiments of the invention are specified in the subclaims.

It is provided that a mask is applied on the side of the basic carrier opposite to the silicon drift detector cells, which mask projects with ridges above the opening of the basic carrier, the ridge pattern following the course of the boundary strips of adjacent silicon drift detector cells. Furthermore, the mask covers the outer edge region of the outer silicon drift detector cells. The mask is configured for covering the boundary strips and outer edge regions of the outer silicon drift detector cells and for shielding them from incident X-ray photons.

As a result of being fitted to the basic carrier, the mask lies directly above the silicon drift detector cells in the opening of the basic carrier, that is to say that the ridges lie directly above the edge strips of silicon drift detector cells that adjoin one another. This position is important for the shielding function of the ridges since the present X-ray detector module is intended to be used also to examine X-ray photon sources from the immediate vicinity. Since X-ray photons can then impinge on the detector area from a considerable angle of incidence range, it is necessary to prevent X-ray photons from being able to impinge at an angle laterally past the ridges into an edge region of a silicon drift detector cell.

In this case, the material and the thickness of the mask should be chosen such that at least 90% of all incident X-ray photons with the energy of interest are absorbed in the mask material. Preferably, at least 99% of all incident X-ray photons should be absorbed for sufficient shielding; this means that the product of the absorption coefficient µ and the thickness d of the mask should be at least 4.8, such that the desired absorption is achieved in accordance with $e^{-\mu d}$.

Said mask prevents suppression of events which would be caused by X-ray photons incident into the edge region of a silicon drift detector cell. The interception of X-ray photons which would impinge into the edge region of a silicon drift detector cell prevents the recording of events in which there is almost no longer a correlation between the measurement signal of the silicon drift detector cell and the energy of the X-ray photon. This is because in the case of hits in the edge region of a cell practically the entire spectrum of possible measurement signals can occur, from a measurement signal near through to a measurement signal corresponding to a completely absorbed X-ray photon energy. Therefore, such hits in the edge region lead to an essentially energy-independent background spectrum.

It has been found that even relatively narrow ridges, that is to say the covering of the very narrow boundary strip of adjacent silicon drift detector cells suffices to suppress the virtually energy-independent background as a result of poorly measured events. A width within the range of 30 to 300 µm, preferably within the range of 75 to 250 µm, particularly preferably within the range of 125 to 175 µm, already suffices for these purposes. By virtue of such narrow ridges above the boundary strips of adjacent silicon drift detector cells, the sensitive detector area is only reduced to a tenable extent. By approximately half the distances, the mask can project over the outer edge of the sensitive region of the outer silicon drift detector cells. The ridges can vary in width along their length. What is crucial is that the boundary regions of adjacent cells in which only inadequate energy reconstruction is possible are covered. The boundary strips do not necessarily have a constant width since, on account of the field distribution in the drift detector cells, the boundary strips to be covered do not necessarily have a straight boundary line.

It is further preferred also to provide ridges in the mask pattern which cover conductor tracks and transistors in the underlying silicon drift detector cells, in order to shield them from incident X-ray photons. This brings about a further suppression of potentially very poorly measured events which would act as energy-independent background.

In order to provide for a detector module construction which is as compact as possible, in particular a minimum extent beyond the sensitive detector area, it is advantageous to form the feeding and output lines with respect to the sensor chip by means of metallic conductor tracks on the basic carrier and, where necessary, to realize metal tracks from the front side with the desired metal tracks on the rear side of the basic carrier by means of plated-through holes, that is to say continuous openings containing conductor material.

With regard to the materials for producing the mask, the following should be taken into account. The detectability of phosphorus ideally necessitates the use of a mask material having a lower atomic number than phosphorus (e.g. Al). However, the absorbance of such materials at relatively high energies is so low that large ridge thicknesses would be necessary in the direction of incidence of the X-ray photons. The disadvantage of heavy elements is that the parasitic fluorescence emerging from them would reach the detector and thus corrupt the measurement. Therefore, it may be provided, in principle, to provide different masks for different energy ranges provided and to mount them as required. By way of example, titanium is suitable as mask material for energies <4.9 keV, zirconium is well suited for energies of between approximately 2.7 keV and 17.9 keV, and europium (or heavier lanthanide elements) is suitable in the range of from 7.4 keV to 48.5 key.

Preferably, the circuits provided for reading out and for amplifying the signals of the silicon drift detector cells are integrated on one circuit chip. The circuit chip is fixed on one end of an elongate, flexible conductor track carrier containing the required conductor tracks connected to the associated connections on the chip. The flexible conductor track carrier is stabilized in the region of the chip, on the side opposite to the chip, by fixing on a rigid circuit carrier. By virtue of this arrangement, the flexible conductor track carrier can be led in an arc in the region on the other side of this rigid circuit carrier, in order to enable the conductor track carrier to be led in a flexible and space-saving manner. On the other hand, the rigid circuit carrier ensures sufficient stability. An essential advantage of this arrangement is that the conductor track carrier can be embodied "in one piece" over its entire length, that is to say from the connection points to which the connections of the circuit chip are connected as far as the end at which a transfer into a cable is provided, that is to say that, apart from the linking connection to the circuit chip, which can be realized by wire bonding the connection at the circuit chip onto a connection point on the conductor track carrier, a further separate electrical connection is no longer required.

The conductor track carrier can be formed e.g. from a multiplicity of films stacked one above another, each film carrying in each case a plurality of conductor tracks on its surface. A flexible conductor track carrier with a multiplicity of conductor track planes is realized in this way. This makes it possible to accommodate a large number of conductor tracks in a conductor track carrier with relatively small cross-sectional dimensions.

In order to enable a transition to a cable from the conductor track carrier, it is advantageous to provide the conductor track carrier with a widening region having a larger width at its end remote from the circuit chip. It is then possible to accommodate a multiplicity of contact areas in fanned-out fashion on this enlarged area, each contact area being assigned to a conductor track which ends in the associated contact area. This widening significantly increases the space available for connecting the conductor tracks to the cores of a cable, which simplifies the production of the connections and reduces their susceptibility to faults, since more space is available for the connections.

In one advantageous embodiment, the widening region of the conductor track carrier can be bent in tubular form in order that the increased width extent caused by the widening of the conductor track carrier is reduced again in this way.

In one preferred embodiment, the X-ray detector module can be arranged successively in a sensor head one after another the mask, the basic carrier, the sensor chip, the cover with a radiation shield, the circuit carrier and the circuit chip, the cross-sectional form of the sensor head essentially corresponding to the outer contour of the basic carrier, the sensor head being fitted to a cooling tube having in turn essentially the same cross-sectional form. The tubularly bent widening region of the conductor track carrier can bear on the inner wall of the cooling tube.

An interposed piece with a Peltier element for cooling can be incorporated between the sensor head and cooling tube. The cooling tube itself serves for dissipating heat; therefore, it is preferably composed of a material having good thermal conductivity. In specific applications it is necessary for the cooling tube to be actively cooled, e.g. if the X-ray detector module is arranged in vacuo and heat dissipation by convection into the surrounding air is therefore not possible.

By virtue of the construction of the X-ray detector module, which essentially corresponds to the outer contour of the basic carrier in cross section over its entire length, a very compact construction is realized which, moreover, makes it possible to arrange a plurality of X-ray detector modules of this type alongside one another, such that the basic carriers of adjacent X-ray detector modules bear directly against one another, thereby minimizing the dead space between adjacent X-ray detector modules.

In one advantageous embodiment, each module has a sensor chip having 7 silicon drift detector cells each having the form of an equilateral hexagon, a central cell being surrounded by six cells having the same outer form. The basic carrier preferably likewise has the outer form of an equilateral hexagon which projects slightly beyond the outer edge of the sensor chip. This hexagonal embodiment makes it possible to assemble a plurality of detector modules with their basic carriers bearing directly against one another once again with a central X-ray detector module and six X-ray detector modules arranged around the latter. The arrangement can be extended in any desired manner as necessary.

BRIEF DESCRIPTION OF THE DRAWING FIGURES

The invention is explained below on the basis of an exemplary embodiment in the drawings, in which.

DETAILED DESCRIPTION OF THE PREFERRED EMBODIMENT

Figure 1:
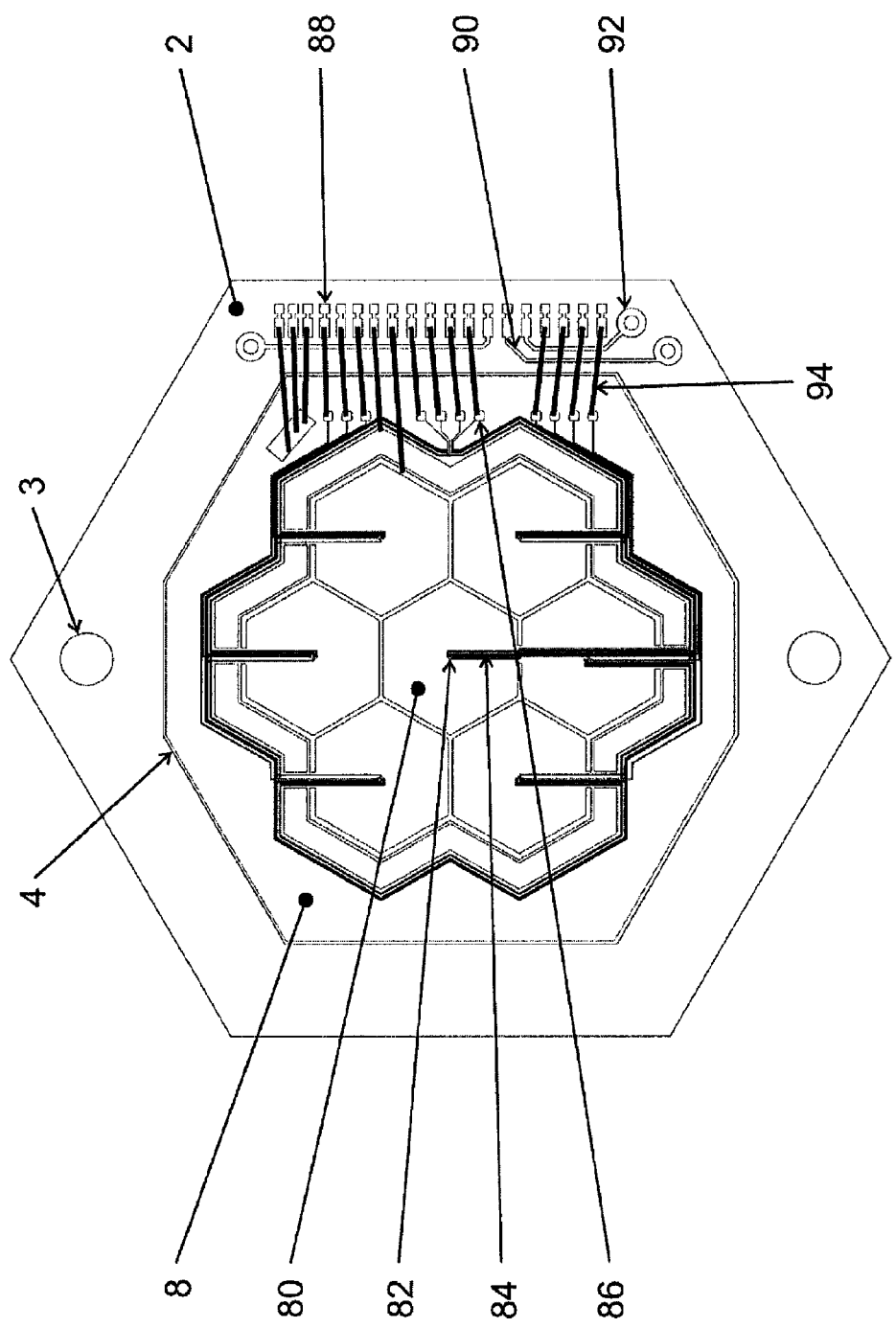
FIG. 1 shows a schematic plan view of the basic carrier with sensor chip inserted.
Figure 2:
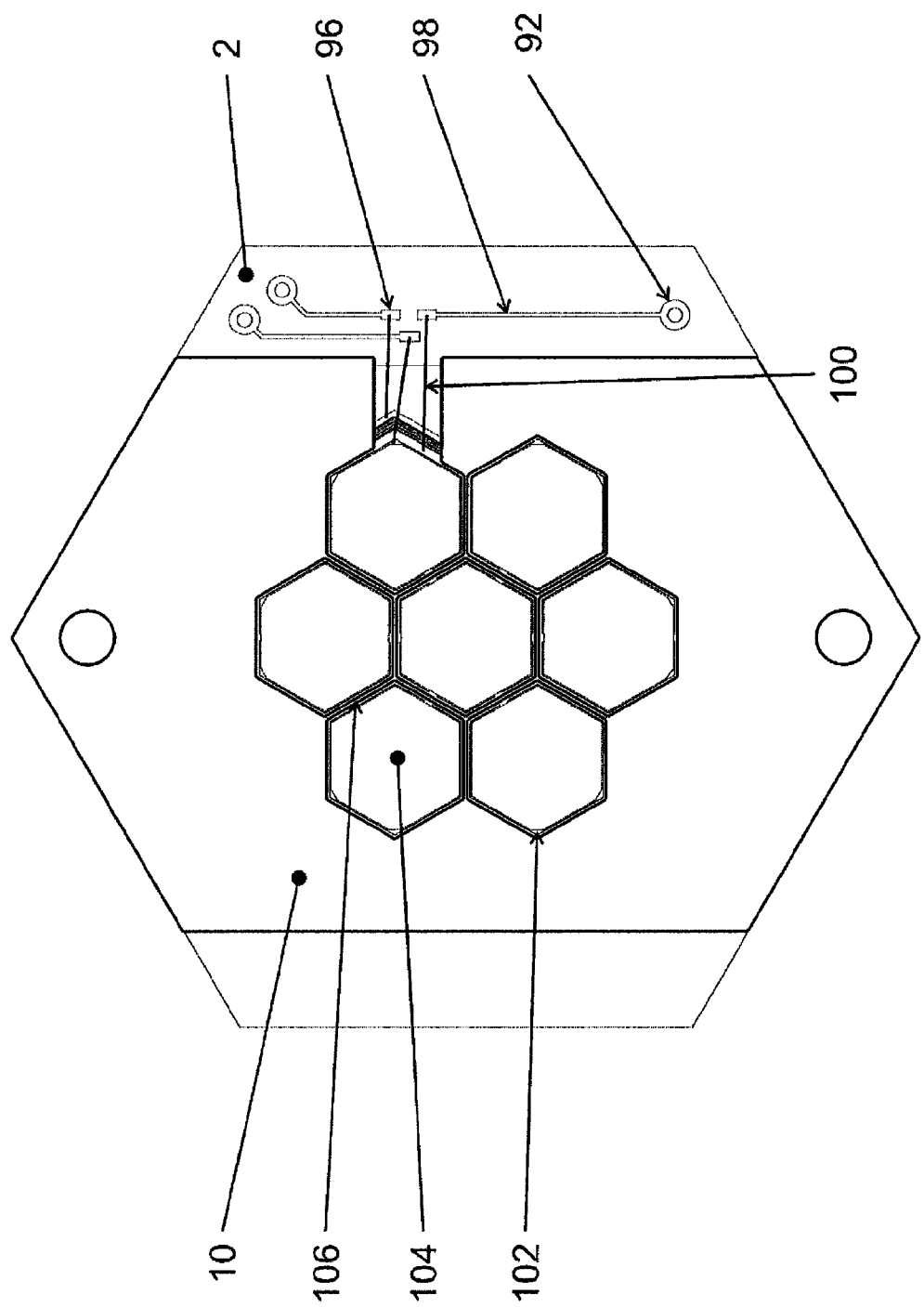
FIG. 2 shows a schematic plan view of the mask and the underlying sensitive surface of the sensor chip and that of the surrounding basic carrier.

FIG. 1 shows a plan view of the basic carrier 2 with inserted sensor chip 8 in plan view from the direction of the remaining components of the X-ray detector module. FIG. 2 shows the plan view of the other side of the basic carrier 2, wherein the sensitive detector cells can be seen through the opening of the frame-type basic carrier 2 and the mask 10. The sensor chip 8 is accommodated with an accurate fit in the cutout 4 (see FIG. 3) of the basic carrier 2, whereby accurate positioning of the sensor chip 8 in the construction can be ensured.

The mask 10 is provided with ridges 106 which project into the opening of the frame-type basic carrier 2 and run over the sensor chip 8. Their course is configured such that they cover the boundary strips of adjacent silicon drift detector cells 80 which adjoin one another. The outer contour of the opening of the mask 10 is shaped in such a way that the outer edge regions of the outer silicon drift detector cells are covered by it, such that together with the ridges 106 defined entrance windows 104 are formed, behind each of which lies a silicon drift detector cell whose outer edge regions are covered by the mask 10. The metallization of the sensor chip is indicated by the reference symbol 104.

The thickness of the mask layer 10 is chosen such that a maximally extensive absorption of X-ray photons in the range of interest is achieved for a given material of the mask. In the case of an energy range of interest of from 2 keV to 35 keV, it is possible to provide e.g. a mask composed of zirconium having a layer thickness of 490 μm. The ridge width, which, given perpendicular incidence, corresponds to the width of the covered boundary strip of adjacent silicon drift detector cells, can preferably lie within the range of 125 to 175 μm. This results in sufficient shielding of the boundary strip, in which the absorption of X-ray photons would lead to measurement results having very poor correlation with the X-ray photon energy. On the other hand, the detector area covered by the narrow ridges is proportionately relatively small, such that the sensitive surface is reduced overall only to a tenable extent.

Figure 3:
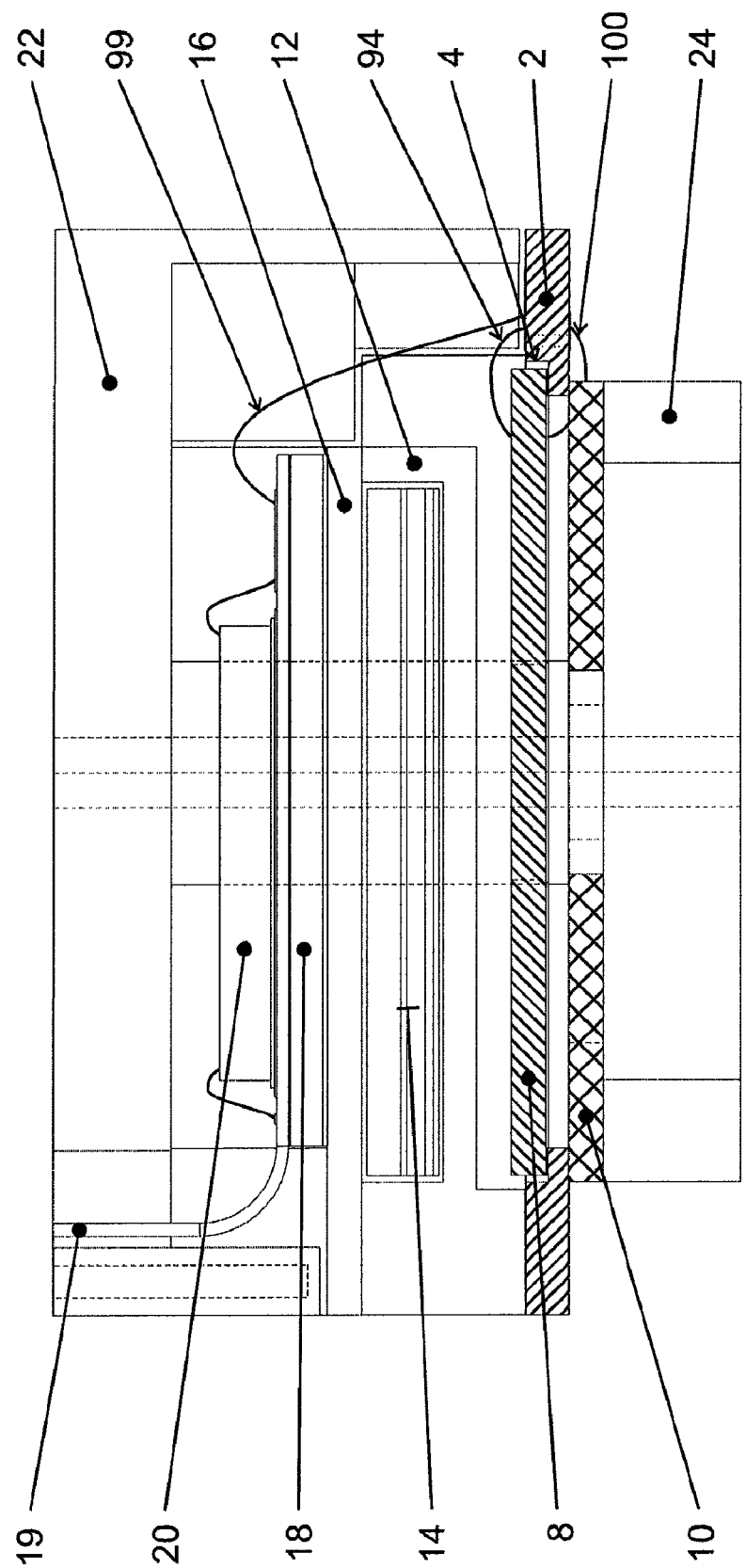
FIG. 3 shows a cross-sectional view of the sensor head.

The construction provided, which can also be seen in the sectional illustration of FIG. 3, namely fitting the mask to the side of the basic carrier 2 opposite to the cutout 4, has the effect that the mask 10 and its ridges lie directly above the regions to be covered by them. This spatially close arrangement of the mask above the sensor chip is important for applications in which the X-ray detector module is brought very close to the X-ray source. In such applications, a relatively large range of angles of incidence of X-ray photons is covered by the sensor chip 8. A reliable shielding from X-ray photons in the boundary regions of adjacent cells can be achieved only when the shielding ridges lie very close above the surface of the silicon drift detector cells.

The electrical connection of the sensor chip 8 is described below, firstly with reference to FIGS. 1 to 3. Conductor tracks 84 serving for electrical supply and for outputting measurement signals are integrated into the sensor chip 8. Said conductor tracks 84 (FIG. 1) are brought together at one side of the octagonal sensor chip 8, where they end in each case in a so-called bonding pad 86, that is to say a small contact area. Each bonding pad 86 is connected by a bonding wire 94 to an assigned bonding pad 88 on the basic carrier 2.

On the opposite side (FIG. 2), bonding wires 100 likewise lead respectively to bonding pads 96. The conductor tracks 98 issuing therefrom lead in each case to a plated-through hole 92, that is to say a continuous opening containing conductor material. Through these plated-through holes 92, the conductor tracks 98 are connected to associated conductor tracks 90 on the opposite side (FIG. 1). This electrical connection by means of plated-through holes is spatially very compact, on the one hand, and not very susceptible to faults or interference, on the other hand. The conductor tracks 84, 90 and 98 are preferably conductor tracks applied on the basic carrier 2 using thin-film technology.

From the collective location of the electrical connections that can be seen in FIG. 1, namely the series of bonding pads 88, further electrical connection is then effected to a circuit chip 20 containing the circuits (e.g. preamplifiers) used for supplying the sensor chip 8 and for conditioning the signals of the silicon drift detector cells. As shown in FIG. 3, this electrical connection is effected by means of bonding wires 99 which lead to contact points on a conductor track carrier 19 on which the circuit chip 20 is fixed. The conductor track carrier 19 is an elongate, flexible and flat track-shaped part which contains a multiplicity of conductor tracks running through it. Such a conductor track carrier 19 may e.g. comprise a multiplicity of films which are stacked one above another and which each carry a plurality of conductor tracks on their surface, such that a multiplicity of conductor track planes are formed in the conductor track carrier 19. For stabilization purposes, the conductor track carrier is fixed onto a fixed circuit carrier 18 in the region of the circuit chip 20.

The lines issuing from the circuit chip 20 are in each case connected by means of a bonding wire to a contact point on the flexible conductor track carrier 19 and thus to one of the conductor tracks of said conductor track carrier. In the region beyond the circuit carrier 18, the flexible conductor track carrier is then led in an arcuately curved manner, as shown in FIG. 3.

Figure 6:
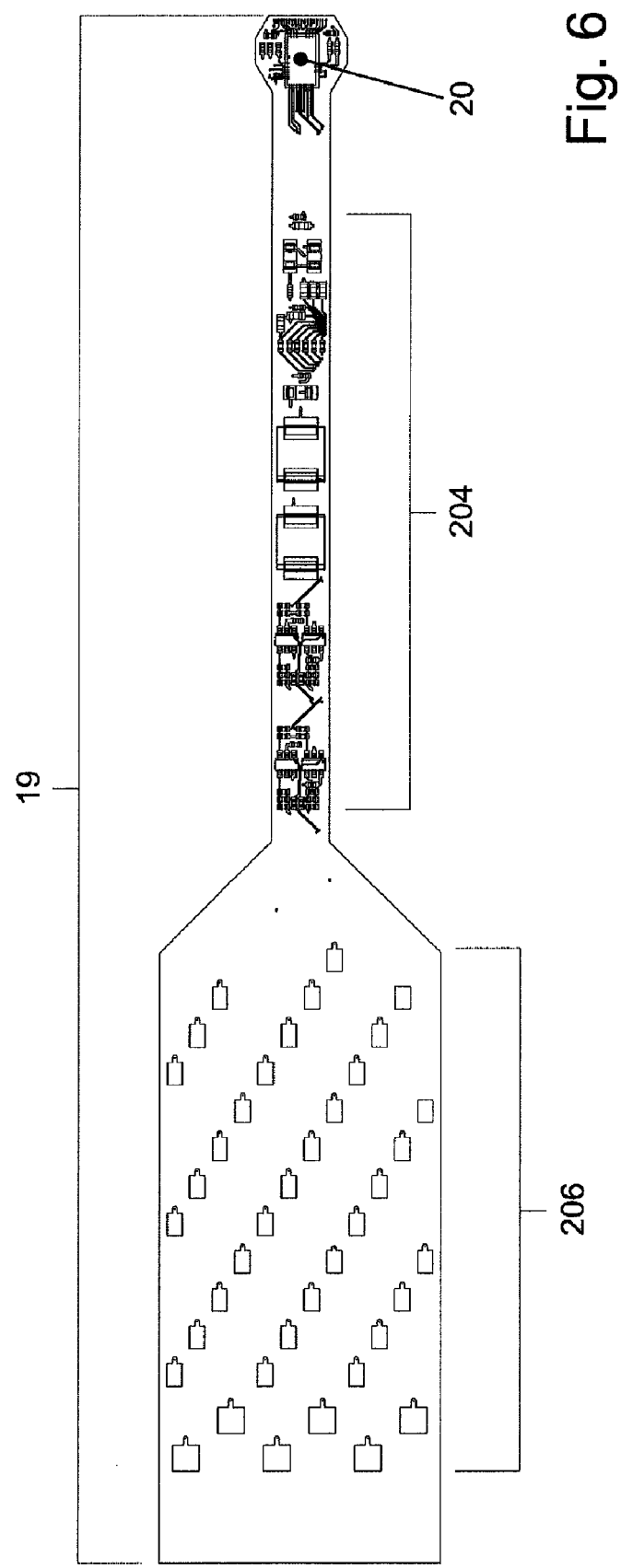
FIG. 6 shows a plan view of the conductor track carrier in a state lying flat.

A schematic plan view of the conductor track carrier 19 is shown in FIG. 6. At one of its ends, the conductor track carrier 19 carries the circuit chip 20 fixed thereon, the conductor track carrier 19 being stabilized in this region by a fixed circuit carrier 18 that is fixed on the side opposite to the circuit chip. This construction, namely the fixing of the circuit chip 20 on the conductor track carrier 19 itself, makes it possible to embody the conductor tracks in one piece proceeding from their connection to the contact points on the circuit chip 20, that is to say without further connections by bonding wires. In the prior art, by contrast, the circuit chip was held directly on a circuit carrier and the conductor track carrier then began outside the construction of circuit carrier and circuit chip. A further electrical connection by bonding wires was required as a result.

By virtue of the flexible configuration of the conductor track carrier 19, the latter can then be led away in an arcuately curved manner in the region outside the rigid circuit carrier 18. A multiplicity of electrical circuits 204 are provided on the conductor track carrier 19 remote from the region provided for the curvature of the conductor track carrier, said electrical circuits being provided for the further conditioning of the electrical detector cell signals for the forwarding thereof. They are in particular driver circuits which improve the transition capability of the signals on the subsequent lines. This arrangement of the circuits 204 remote from the circuit chip 20 and the sensor chip 8 has the advantage that the waste heat of the circuits 204, which is harmful to the operation of the sensor chip 8, can have no or only a negligible effect on the sensor chip 8. By contrast, the circuits in the circuit chip 20 have to be arranged close to the sensor chip 8. The circuits, in particular the preamplifier circuits, on the circuit chip 20 have to lie close to the sensor chip 8 because any lengthening of the line paths before the preamplifiers increases the capacitances before the preamplifier inputs, which in turn leads to a noise that increases with the capacitance, and thus to a deterioration in the resolution. The waste heat of the circuit chip has to be dissipated by cooling.

The strip-type region of the flexible line carrier 19 with the electrical circuits 204 is adjoined by a widening region 206. Here a multiplicity of contact pads or contact areas are arranged, each of which is assigned to one of the conductor tracks of the flexible conductor track carrier 19 and is connected thereto. The widening region 206 makes it possible to arrange this multiplicity of contact points in fanned-out fashion to an extent such that it is possible, from spatial standpoints, to connect the contact pads in each case to a core of a cable. A plugless cable link is realized by means of the direct connection of the contact areas to the cores of a cable.

Figure 4:
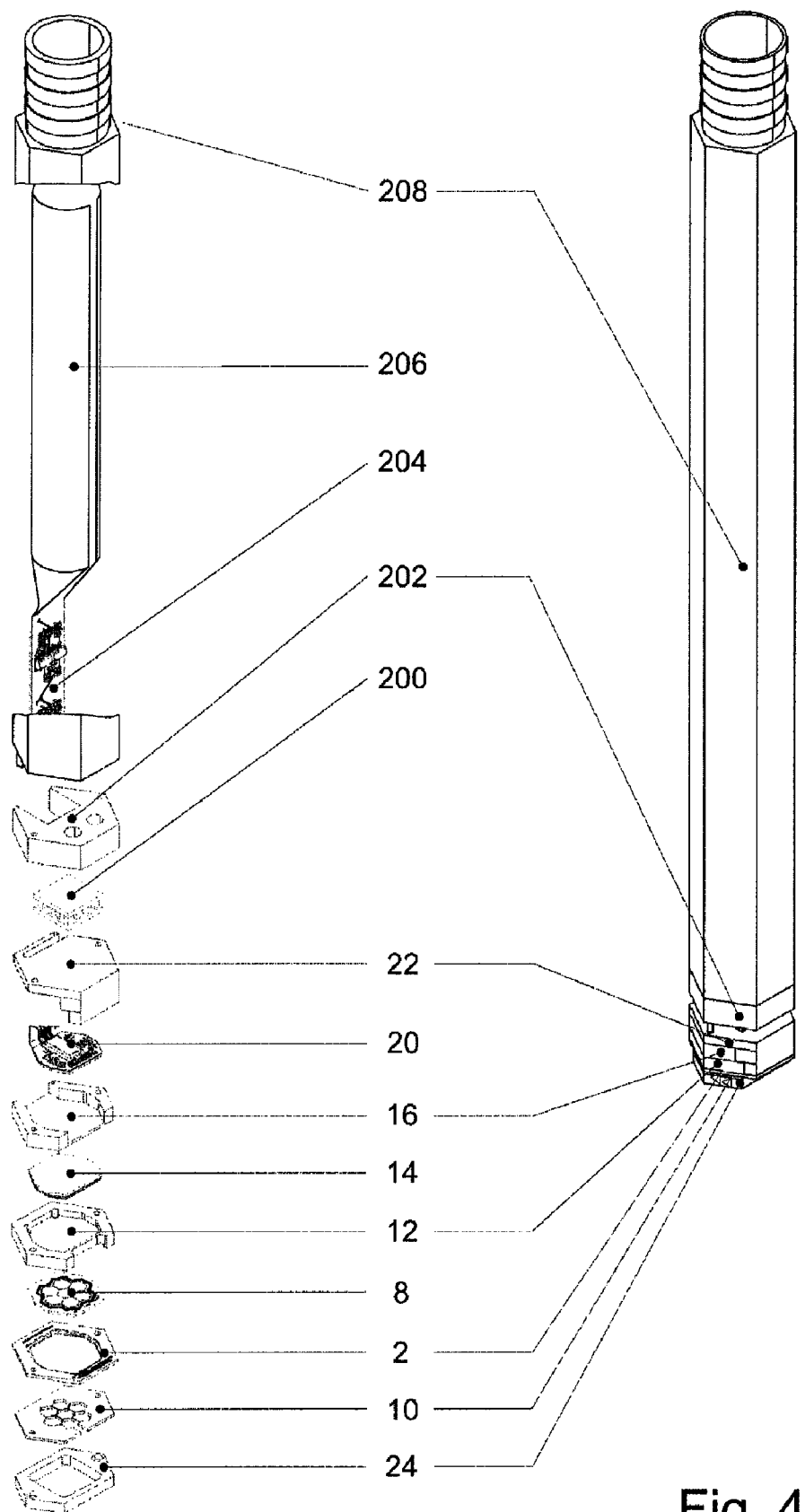
FIG. 4 shows a perspective exploded illustration of the components of the detector module and of the combined X-ray detector module.

In order to reduce the lateral extent of the widening region 206, the latter can be bent in tubular form after the production of the electrical connections at the contact pads in the widening region 206, as is illustrated in the left-hand part of FIG. 4. The widening region 206 can thus be accommodated in tubular form in a cooling tube 208.

Figure 5:
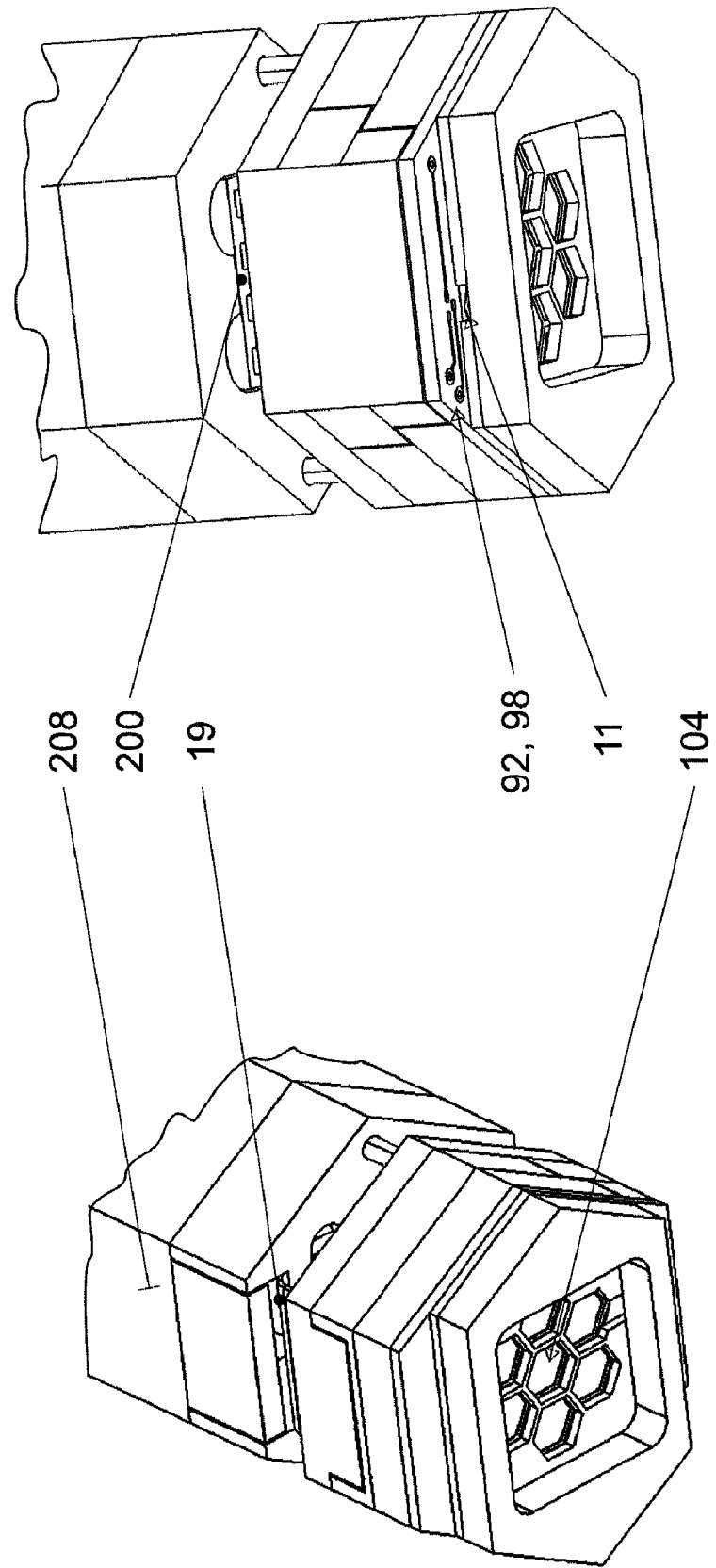
FIG. 5 shows a perspective detail view of the front end of the X-ray detector module from two sides.

The construction of the X-ray detector module in terms of components will now be explained with reference to FIGS. 4 and 5. On the outside there is a covering cap 24, which serves for absorbing Ti back-fluorescence from the screws. The covering cap 24 is followed by the mask 10. The mask 10 is in turn fitted to the basic carrier 2, into which on its other side the sensor chip 8 is inserted into the cutout of the basic carrier. The sensor chip 8 is followed by a first cover 12, which has a cutout on its side remote from the sensor chip 8, into which cutout is inserted a radiation shield 14 comprising a plurality of layers. This is followed by a second cover 16, which in turn has a cutout on its side remote from the sensor chip 8, into which cutout is inserted the circuit carrier 18 with the flexible conductor track carrier 19 fixed thereon and the circuit chip 20 fixed above the latter. This space for the circuit chip 20 is closed by a third cover 22, which has, on one side, a slot for leading through the flexible conductor track carrier 19. The actual sensor head ends with the third cover 22.

An interposed piece constructed from a Peltier element 200 and a heat spreader 202 is placed between the sensor head and the outer cooling tube 208. The Peltier element 200 serves for cooling and dissipating the heat from the circuit chip 20 and sensor chip 8. Dissipated heat is distributed into the cooling tube 208 by means of the heat spreader. If the cooling tube 208 is in contact with the surrounding air, it is not absolutely necessary for the cooling tube 208 to be cooled since it is then in heat exchange with the surroundings with a relatively large surface area and can thus emit heat.

As can be discerned from FIG. 4, all the components which in combination produce the X-ray detector module have a cross-sectional form which corresponds to that of the basic carrier or lies within this cross-sectional form, that is to say that, in a projection onto the plane of the basic carrier, no part projects beyond the outer contour of the basic carrier 2. The combined X-ray detector module then has over its entire length a cross-sectional form which does not project beyond that of the basic carrier 2. As a result, it is possible to arrange a plurality of X-ray detector modules alongside one another, in which case said modules can be combined with their basic carriers 2 abutting one another, such that it is possible to assemble an array composed of a plurality of X-ray detector modules with minimal dead space between the modules. In the preferred embodiment illustrated, the sensor head together with the cooling tube form a pin-like housing with a hexagonal outer form.

The radiation shield 14 can comprise a plurality of layers, as illustrated in FIG. 3. Said radiation shield 14 has the task of protecting the electronics against radiation damage. At the same time, it must be constructed in such a way that the unavoidably excited fluorescence does not lead to corruptions of the measured spectra or in turn to radiation damage of the electronics. The radiation shield can comprise e.g. layers composed of tantalum, titanium and aluminum, the tantalum serving for protecting the electronics and the other materials serving for reducing the back-fluorescence onto the sensor chip 8. The aluminum can also be dispensed with if the cover is produced e.g. from aluminum nitride, such that the shielding effect of the aluminum can be brought about by the cover 12.

The invention claimed is:

1. An X-ray detector module comprising a plurality of silicon drift detector cells arranged alongside one another on a sensor chip, the sensor chip being accommodated in a cutout of a frame-type basic carrier, such that the sensitive sensor chip surface lies in the opening of the frame-type basic carrier, wherein a mask is fixed on the side of the basic carrier opposite to the cutout, which mask covers the outer edge regions of outer silicon drift detector cells and projects with ridges above the sensor chip into the opening of the basic carrier, the ridges being arranged in such a way that they cover boundary strips of adjacent silicon drift detector cells in order that the outer edge regions and boundary strips covered by the mask are shielded from incident X-ray photons.

2. The X-ray detector module as claimed in claim 1, wherein the lines required for supplying and reading from the sensor chip comprise metal tracks on the front and rear sides of the basic carrier, required connections between front and rear sides between specific metal tracks comprising plated-through holes of the basic carrier.

3. The X-ray detector module as claimed in claim 2, wherein the metal tracks comprise metallic thin-film tracks.

4. The X-ray detector module as claimed in claim 1, wherein the substrate material of the basic carrier comprises ceramics based on an element selected from the group consisting of aluminum and beryllium.

5. The X-ray detector module as claimed in claim 1, wherein further ridges are provided in the mask pattern, which cover conductor tracks and transistors in the underlying silicon drift detector cells in order to shield them from incident X-ray photons.

6. The X-ray detector module as claimed in claim 1, wherein the mask material includes at least one element selected from the group consisting of zirconium, titanium, aluminum, europium, and combinations thereof.

7. The X-ray detector module as claimed in claim 6, wherein the mask material is composed of a material selected from the group consisting of zirconium, $ZrO_2$, and combinations thereof.

8. The X-ray detector module as claimed in claim 1, wherein the ridges of the mask present a width within the range of 30 to 300 μm.

9. The X-ray detector module as claimed in claim 1, wherein a cover covering the sensor chip is fixed on the basic carrier on the side of the sensor chip, said side of the cover remote from the sensor chip being provided with a cutout which covers the area of the sensor chip in projection and in which a disk-shaped radiation shielding body is arranged.

10. The X-ray detector module as claimed in claim 9, wherein the cover is produced from a material selected from the group consisting of $Al_2O_3$ and AlN.

11. The X-ray detector module as claimed in claim 9, wherein the radiation shielding body contains elements selected from the group consisting of: 1) tantalum and titanium; and 2) tantalum, titanium, and aluminum.

12. The X-ray detector module as claimed in claim 9, wherein circuits are provided for reading out and amplifying the signals of the silicon drift detector cells, said circuits being integrated on a circuit chip fixed on one end of an elongate, flexible conductor track carrier, which contains conductor tracks which are provided for supplying and conducting away electrical signals and supply voltages and are connected to the associated connections on the chip, the flexible conductor track carrier being stabilized in the region of the chip, on the side opposite to the chip, by fixing on a rigid circuit carrier.

13. The X-ray detector module as claimed in claim 12, wherein the flexible conductor track carrier comprises a multiplicity of films which are stacked one above another and each carry a plurality of conductor tracks on their surface.

14. The X-ray detector module as claimed in claim 12, wherein the circuit carrier lies in a plane parallel to the plane of the sensor chip, and wherein the conductor track carrier is led in a curve of approximately 90° in the region adjoining the circuit carrier in order to lead away from the circuit carrier in a direction essentially perpendicular to the planes of the sensor chip and of said circuit carrier.

15. The X-ray detector module as claimed in one of claims 12, wherein line driver circuits are arranged remote from the sensor chip and the circuit chip on the conductor track carrier in order to condition the signals—preamplified in the circuit chip—of the silicon drift detector cells for the further transmission on lines.

16. The X-ray detector module as claimed in one of claims 12, wherein the width of the elongate conductor track carrier increases remote from the circuit chip, and in that a multiplicity of contact areas are provided in a manner distributed in this widened area, each of which contact areas is assigned to a conductor track of the conductor track carrier and is connected to it, and which are in each case connected to a conductor track and to a core that leads into a cable.

17. The X-ray detector module as claimed in claim 16, wherein a cable includes cores that are directly connected to contact areas in the widening region of the conductor track carrier in order thus to provide a plugless cable link.

18. The X-ray detector module as claimed in claim 16, wherein the conductor track carrier is bent in tubular fashion in the widening region in order to reduce its increased width extent caused by the widening.

19. The X-ray detector module as claimed in claim 16, wherein the mask, basic carrier, sensor chip, cover, radiation shield, circuit carrier, conductor track carrier and circuit chip as sensor head are mounted successively one after another, the cross-sectional form of the sensor head essentially corresponding to the outer contour of the basic carrier, the sensor head being fitted to a cooling tube having essentially the same cross-sectional form.

20. The X-ray detector module as claimed in claim 19, wherein the tubularly bent widening region of the conductor track carrier bears on the inner wall of the cooling tube.

21. The X-ray detector module as claimed in claim 19, wherein an interposed piece with a Peltier element for cooling is incorporated between the sensor head and cooling tube.

22. The X-ray detector module as claimed in claim 19, wherein the sensor chip comprises seven silicon drift detector cells which each have the form of an equilateral hexagon, which are arranged on the sensor chip with a central silicon drift detector cell and six silicon drift detector cells arranged in honeycomb-shaped fashion around the latter.

23. The X-ray detector module as claimed in claim 22, wherein the components of the X-ray detector module which follow the basic carrier in a direction of the longitudinal axis perpendicular to the plane of the basic carrier do not project beyond the outer contour of the basic carrier in cross section perpendicular to the longitudinal axis.

24. The X-ray detector module as claimed in claim 23, wherein the sensor head and the cooling tube correspond to the outer contour of the basic carrier in cross section and thus produce a cross-sectionally hexagonal, pinlike outer form of the X-ray detector module.

25. The X-ray detector module as claimed in claim 24, wherein the outer contour of the basic carrier has the form of an equilateral hexagon.

\* \* \* \* \*

UNITED STATES PATENT AND TRADEMARK OFFICE
CERTIFICATE OF CORRECTION

| | | |
|---|---|---|
| PATENT NO. | : 7,812,316 B2 | Page 1 of 1 |
| APPLICATION NO. | : 12/063566 | |
| DATED | : October 12, 2010 | |
| INVENTOR(S) | : Karsten Hansen and Alexander Venzmer | |

It is certified that error appears in the above-identified patent and that said Letters Patent is hereby corrected as shown below:

Title page, item (73); the named Assignee reading "Deutsches Electronen-Synchroteron Desy" should read: --Deutsches Elektronen-Synchrotron DESY--

Signed and Sealed this
Fifteenth Day of March, 2011

David J. Kappos
*Director of the United States Patent and Trademark Office*